(12) United States Patent
Yuan et al.

(10) Patent No.: US 12,438,030 B2
(45) Date of Patent: Oct. 7, 2025

(54) APPARATUS FOR TRANSFERRING LIGHT-EMITTING DIODE CHIP

(71) Applicant: BOE TECHNOLOGY GROUP CO., LTD., Beijing (CN)

(72) Inventors: Guangcai Yuan, Beijing (CN); Haixu Li, Beijing (CN); Xin Gu, Beijing (CN); Jing Feng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 989 days.

(21) Appl. No.: 17/488,538

(22) Filed: Sep. 29, 2021

(65) Prior Publication Data
US 2022/0246460 A1 Aug. 4, 2022

(30) Foreign Application Priority Data
Jan. 29, 2021 (CN) .......................... 202120259021.0

(51) Int. Cl.
*H01L 21/683* (2006.01)
*B65G 43/10* (2006.01)
(Continued)

(52) U.S. Cl.
CPC ...... *H01L 21/6835* (2013.01); *H01L 25/0753* (2013.01); *H10H 20/857* (2025.01);
(Continued)

(58) Field of Classification Search
CPC . H01L 21/6835; H01L 25/0753; H01L 33/62; H01L 2221/68309;
(Continued)

(56) References Cited

U.S. PATENT DOCUMENTS 1,617,241 A * 2/1927 Fessenden ............... H04N 3/08
359/231
4,405,218 A * 9/1983 Wirth ..................... G03B 41/06
352/198

(Continued)

FOREIGN PATENT DOCUMENTS

EP 1339220 A1 * 8/2003 .............. B41J 2/465
JP 2005009150 A * 1/2005

OTHER PUBLICATIONS

Burton, Harry Edward, "The Optics of Euclid", Journal of the Optical Society of America (Year: 1945).*
(Continued)

*Primary Examiner* — Ernesto A Suarez
*Assistant Examiner* — Laurence R Brothers
(74) *Attorney, Agent, or Firm* — HOUTTEMAN LAW LLC (57) ABSTRACT

The disclosure provides an apparatus for transferring LED chips, including: first light source configured to generate and emit first light rays; first support structure configured to carry load substrate, load substrate including light-transmissive substrate and the LED chips fixed on side of the light-transmissive substrate away from first light source by dissociation adhesive; second support structure configured to carry to-be-transferred substrate on side of the LED chips away from light-transmissive substrate; and optical control mechanism on side of light-transmissive substrate away from the LED chips and configured to control propagation direction of first light rays that irradiate onto first radiation region of the optical control mechanism to form target light rays that irradiate onto target radiation region of load substrate, so that dissociation adhesive in target radiation region is dissociated to transfer LED chips in target radiation region to to-be-transferred substrate.

11 Claims, 5 Drawing Sheets

(51) Int. Cl.
*H01L 25/075* (2006.01)
*H10H 20/857* (2025.01)
*H10H 20/01* (2025.01)

(52) U.S. Cl.
CPC .... *B65G 43/10* (2013.01); *H01L 2221/68309* (2013.01); *H01L 2221/68354* (2013.01); *H01L 2221/68363* (2013.01); *H01L 2221/68368* (2013.01); *H01L 2221/68381* (2013.01)

(58) Field of Classification Search
CPC . H01L 2221/68354; H01L 2221/68368; H01L 2221/68381; B65G 43/10
See application file for complete search history.

(56) References Cited

U.S. PATENT DOCUMENTS

| | | | | |
|---|---|---|---|---|
| 5,157,235 A | * | 10/1992 | Okumura | B23K 26/066 219/121.68 |
| 5,461,212 A | * | 10/1995 | Seiler | B23K 26/073 219/121.75 |
| 5,616,522 A | * | 4/1997 | Mallecot | H01L 23/544 257/E23.179 |
| 6,403,268 B1 | * | 6/2002 | Kawata | G03F 1/20 430/296 |
| 7,822,303 B2 | * | 10/2010 | Cohen | H04J 14/0212 385/11 |
| 8,164,753 B2 | * | 4/2012 | Liu | G03F 9/7084 257/17 |
| 2002/0171090 A1 | * | 11/2002 | Oohata | H01L 25/0753 438/22 |
| 2009/0207868 A1 | * | 8/2009 | Barnes | H01S 3/0092 372/20 |
| 2020/0020825 A1 | * | 1/2020 | Yang | H10H 20/835 |
| 2020/0313035 A1 | * | 10/2020 | Lee | H01L 24/81 |

OTHER PUBLICATIONS

EP-1339220-A1 (Year: 2003).*
JP-2000509150-A (Year: 2000).*
Stern, et al. "Fully convolutional networks for chip-wise defect detection employing photoluminescence images", Journal of Intelligent Manufacturing (Year: 2020).*

* cited by examiner

APPARATUS FOR TRANSFERRING LIGHT-EMITTING DIODE CHIP

CROSS-REFERENCE TO RELATED APPLICATION

This application claims the benefit of priority to Chinese Patent Application No. 202120259021.0 filed on Jan. 29, 2021, the contents of which are incorporated herein in their entirety by reference.

TECHNICAL FIELD

The present disclosure relates to the field of display technology, and particularly relates to an apparatus for transferring light-emitting diode chips.

BACKGROUND

Because light-emitting diodes (LEDs) have many advantages such as high efficiency, high brightness, high reliability, energy saving, and fast response speed, and have obvious superiority in image quality, refresh frequency, power consumption, and brightness, compared with liquid crystal displays (LCDs) and organic light-emitting diodes (OLEDs), LED display devices are regarded as the next generation of mainstream display technology, and thus have attracted much attention.

However, how to transfer a large number of LED chips onto a to-be-transferred substrate becomes a significant challenge for the massive transfer technology of LED chips.

SUMMARY

In a first aspect, an embodiment of the present disclosure provides an apparatus for transferring light emitting diode (LED) chips, including:

a first light source configured to generate and emit first light rays;

a first support structure configured to carry a load substrate, the load substrate including a light-transmissive substrate and the LED chips fixed on a side of the light-transmissive substrate away from the first light source by dissociation adhesive;

a second support structure configured to carry a to-be-transferred substrate, the to-be-transferred substrate being on a side of the LED chips away from the light-transmissive substrate; and an optical control mechanism on a side of the light-transmissive substrate away from the LED chips and configured to control a propagation direction of the first light rays that irradiate onto the first radiation region of the optical control mechanism to form target light rays that irradiate onto a target radiation region of the load substrate, so that the dissociation adhesive in the target radiation region is dissociated to transfer the LED chips in the target radiation region to the to-be-transferred substrate.

In some embodiments, the apparatus further includes:

a second light source configured to generate and emit second light rays, the second light rays passing through the optical control mechanism and irradiating onto the load substrate so as to excite the LED chips to emit light; and an image capture mechanism configured to capture an image of the LED chips that emit light to generate a first image.

In some embodiments, the apparatus further includes:

a first processing mechanism coupled to the image capture mechanism and configured to process the first image generated by the image capture mechanism to generate a quality distribution of the LED chips, the quality distribution including a position and a quality of each of the LED chips.

In some embodiments, the quality of each of the LED chips indicates a stability degree of light emission brightness of the LED chip.

In some embodiments, the LED chips in the target radiation region have a same quality.

In some embodiments, the first light source is a pointolite and the second light source is a line light source.

In some embodiments, the first light source and the second light source are a same light source.

In some embodiments, the optical control mechanism includes: an optical filter device;

the optical filter device includes: a plurality of optical control elements arranged in an array, the optical control elements located in the first radiation region being in an active state, and the optical control elements not located in the first radiation region being in an inactive state; and each of the plurality of optical control elements is configured to control a propagation direction of the received first light rays in response to the optical control element being in the active state, so as to form the target light ray that irradiates onto the target radiation region of the load substrate.

In some embodiments, the first radiation region includes a plurality of first sub-regions, the target radiation region includes a plurality of second sub-regions, and the plurality of first sub-regions are in one-to-one correspondence with the plurality of second sub-regions.

In some embodiments, the apparatus further includes:

a second processing mechanism coupled to the optical filter device and configured to send a control signal to the optical filter device, the control signal including identification information of the plurality of optical control elements in the first radiation region, wherein the optical filter device controls the plurality of optical control elements in the first radiation region to be in the active state according to the control signal.

In some embodiments, each of the plurality of optical control elements is configured to transmit the first light rays that irradiate onto the optical control element in response to the optical control element being in the active state and to block the first light rays that irradiate onto the optical control element in response to the optical control element being in the inactive state.

In some embodiments, the optical filter device includes: a liquid crystal display including a plurality of first pixel units, each of the plurality of first pixel units serving as a corresponding one of the plurality of optical control elements.

In some embodiments, a plane on which the liquid crystal display is located intersects with a surface of the light-transmissive substrate away from the LED chips; and the optical filter device further includes: a reflection element on a side of the liquid crystal display away from the first light source, and configured to reflect the first light rays transmitted from the plurality of optical control elements so as to form the target light rays that irradiate onto the load substrate.

In some embodiments, a plane on which the liquid crystal display is located is parallel to a surface of the light-transmissive substrate away from the LED chips.

In some embodiments, the apparatus further includes a plurality of support mechanisms between the liquid crystal display and the light-transmissive substrate and configured to support the liquid crystal display and the light-transmissive substrate.

In some embodiments, the optical control element is configured to reflect the first light rays that irradiate onto the optical control element to the load substrate in response to the optical control element being in the active state and to reflect the first light rays that irradiate onto the optical control element to a redundant light region in response to the optical control element being in the inactive state, and the redundant light region is on a side of the optical control mechanism away from the load substrate.

In some embodiments, the optical filter device includes: a reflective digital micro-mirror device or a micro-electromechanical system (MEMS) reflective mirror; and the reflective digital micro-mirror and the MEMS reflective mirror each include a plurality of second pixel units, each of the plurality of second pixel units serving as a corresponding one of the plurality of optical control elements.

In some embodiments, the optical control mechanism further includes: a beam control device; and the beam control device is on a light emitting side of the optical filter device and is configured to adjust at least one of a shape, a size and an energy distribution of light spots of the target light rays that irradiate onto the load substrate.

In some embodiments, the beam control device includes: at least one of a beam expander, a galvo scanner, and a field lens.

In some embodiments, the load substrate further includes an alignment mark on a side of the load substrate on which the LED chips are provided, the alignment mark includes a reflective layer and a transparent layer, and the reflective layer is inclined with respect to a surface of the load substrate on which the LED chips are provided.

DETAILED DESCRIPTION

In order to make those skilled in the art better understand the technical solution of the present disclosure, an apparatus for transferring LED chips according to the present disclosure is described in detail below with reference to the accompanying drawings.

The LED chip in the embodiment of the present disclosure may be a sub-millimeter light-emitting diode (abbreviated as Mini LED) chip or a micro light-emitting diode (abbreviated as Micro LED) chip. The LED chip generally includes an epitaxial structure including a P-type semiconductor layer, an intrinsic layer, and an N-type semiconductor layer, an anode pin, and a cathode pin.

Figure 1A:
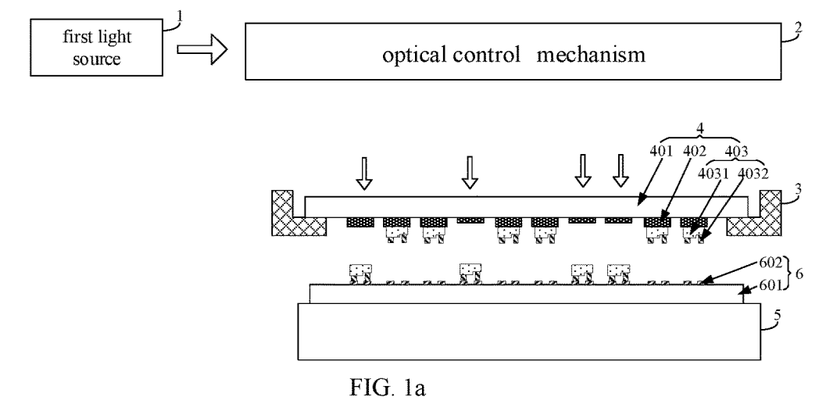
FIG. 1a is a block diagram of a structure of an apparatus for transferring LED chips according to an embodiment of the present disclosure.
Figure 1B:
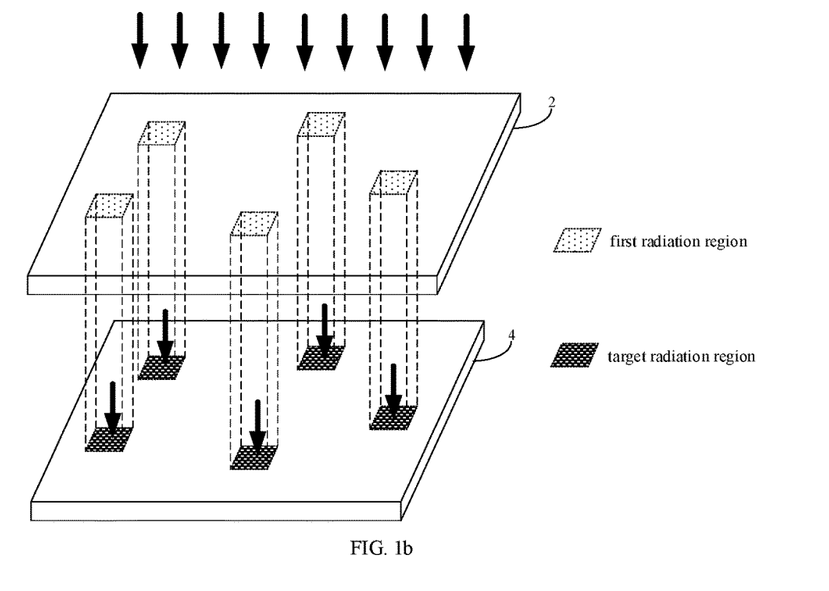
FIG. 1b is a schematic diagram illustrating that first light rays pass through a first radiation region of an optical control mechanism and then irradiate onto a target radiation region of a load substrate according to an embodiment of the present disclosure.

FIG. 1a is a block diagram of a structure of an apparatus for transferring LED chips according to an embodiment of the present disclosure, and FIG. 1b is a schematic diagram illustrating that first light rays pass through a first radiation region of an optical control mechanism and then irradiate onto a target radiation region of a load substrate according to an embodiment of the present disclosure. As shown in FIG. 1a and FIG. 1b, the apparatus for transferring LED chips includes: a first light source 1, a first support structure 3, a second support structure 5 and an optical control mechanism 2. In an embodiment, the first light source 1 is configured to generate and emit first light rays, and the first support structure 3 is configured to carry a load substrate 4. In an embodiment, the first light source may be a pointolite. The load substrate 4 includes a light-transmissive substrate 401 and a plurality of LED chips 403 fixed on a side of the light-transmissive substrate 401 by dissociation adhesive 402. The second support structure 5 is configured to carry a to-be-transferred substrate 6, and the to-be-transferred substrate 6 is on a side of the LED chips 403 away from the light-transmissive substrate 401. The optical control mechanism 2 is on a side of the light-transmissive substrate 401 away from the LED chips 403. The optical control mechanism 2 is configured to control a propagation direction of the first light rays to irradiate onto the first radiation region, so as to form target light rays that irradiate from a side of the light-transmissive substrate 401 away from the LED chips 403 onto the target radiation region of the load substrate 4, so that the dissociation adhesive 402 located in the target radiation region dissociates, and thus the LED chips 403 located in the target radiation region can be transferred to the to-be-transferred substrate 6.

In some embodiments, the first light ray is a laser. For example, the first light ray is an ultraviolet laser.

In an embodiment of the present disclosure, the load substrate 4 is a structure that is prepared in advance. As an example, the dissociation adhesive 402 is first formed on the light-transmissive substrate 401 by spray coating process or spin coating process, and the dissociation adhesive 402 may be formed as a whole layer or a plurality of sub-patterns arranged at intervals, each sub-pattern corresponding to a region to be adhered with the LED chip 403. Then, the LED chips 403 are disposed on the dissociation adhesive 402, where the anode/cathode pins 4032 are located on a side of the epitaxial structure 4031 away from the light-transmissive substrate 401. In an embodiment, the LED chips 403 of the same load substrate 4 may be from the same wafer or from different wafers. The material of the dissociation adhesive 402 is adapted to the wavelength of the selected first light rays, that is, the material characteristic of the dissociation adhesive 402 may be changed after being irradiated by the first light rays. For example, the dissociation adhesive 402 has adhesiveness in a normal state to adhere the LED chips 403 to the light-transmissive substrate 401, and the adhesiveness of the dissociation adhesive 402 is reduced or even disappears (hereinafter referred to as "is dissociated") after being irradiated by the first light rays, so that the LED chips 403 are separated from the light-transmissive substrate 401.

The to-be-transferred substrate 6 (also commonly referred to as a driving backplane) is a substrate to which the LED chips 403 are required to be transferred, and includes a driving circuit 601 and a plurality of connection pads 602, and these connection pads 602 are configured to electrically couple to the node/cathode pins 4032 of the LED chip 403.

When the load substrate 4 and the to-be-transferred substrate 6 are placed on the first support structure 3 and the second support structure 5, respectively, the side of the load substrate 4 on which the LED chips 403 are provided is opposite to the side of the to-be-transferred substrate 6 on which the connection pads 602 are provided.

In an embodiment of the present disclosure, after the first light rays emitted by the first light source 1 arrive at the optical control mechanism 2, the optical control mechanism 2 controls the propagation direction of the first light rays irradiating onto the first radiation region, so as to form the target light rays that irradiate from the side of the light-transmissive substrate 401 away from the LED chips 403 to the target radiation region of the load substrate 4, and then the dissociation adhesive 402 in the target radiation region dissociates, and the LED chips 403 in the target radiation region may be separated from the light-transmissive substrate 401 under gravity, and thus are transferred onto the to-be-transferred substrate 6.

In the process of transferring the LED chips 403, the region of the load substrate 4 other than the target radiation region is not irradiated by the target light rays, and therefore the LED chips 403 not irradiated by the target light rays are not transferred. The target radiation region of the load substrate 4 may be preset according to actual needs. When the first light rays emitted by the first light source 1 may completely cover the first radiation region of the optical control mechanism 2, the target light rays emitted from the optical control mechanism 2 and arriving at the load substrate 4 may irradiate onto only the target radiation region by means of the optical control function of the optical control mechanism 2, thereby achieving the synchronous transfer of the LED chips 403 at specific positions on the load substrate 4. Specific application scenarios will be described later with reference to specific examples.

It should be noted that, in the embodiment of the present disclosure, the first radiation region of the optical control mechanism 2 corresponds to the target radiation region of the load substrate 4 by pre-configuration. The shape, size and distribution of the first radiation region and the shape, size and distribution of the corresponding target radiation region may be configured in advance according to actual conditions. The first radiation region and the target radiation region corresponding to the first radiation region may have the same shape or different shapes. The technical solution of the present disclosure does not limit the shape, size and distribution of the first radiation region and the target radiation region. The case where the first radiation region includes 5 quadrangular sub-regions and the target radiation region includes 5 quadrangular sub-regions shown in FIG. 1b is merely exemplary. In addition, the propagation direction of the target light rays emitted from the optical control mechanism 2 may be perpendicular to (as shown in FIG. 1b) or intersect with the surface of the light-transmissive substrate 401 away from the LED chips 403.

Figure 2A:
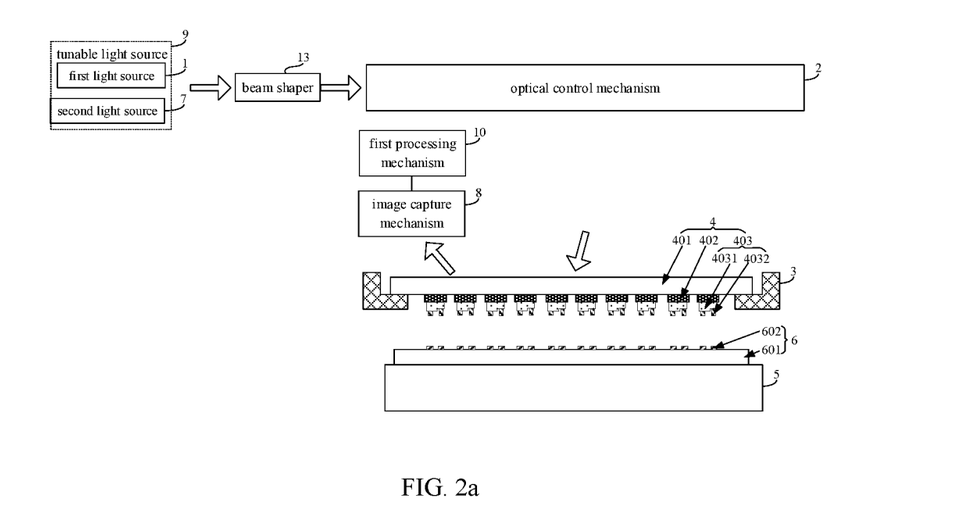
FIG. 2a is a schematic structural diagram of another apparatus for transferring LED chips according to an embodiment of the present disclosure.

FIG. 2a is a schematic structural diagram of another apparatus for transferring LED chips according to an embodiment of the present disclosure, and as shown in FIG. 2a, the apparatus for transferring LED chips includes not only the first light source 1, the first support structure 3, the second support structure 5, and the optical control mechanism 2, but also a second light source 7 and an image capture mechanism 8.

In an embodiment, the second light source 7 is configured to generate and emit second light rays; and the image capture mechanism 8 is configured to receive the second light rays emitted by the LED chips in the second radiation region of the load substrate 4 and generate an image of the LED chips in the second radiation region according to the received second light rays. In an embodiment, the second light source may be a line light source.

In an embodiment of the present disclosure, the second light source 7 and the image capture mechanism 8 are disposed, so that an image of at least a partial region of the load substrate 4 can be captured before the LED chips 403 are transferred, and the quality of each LED chip 403 in the image can be identified subsequently based on the acquired image information. In an embodiment, the quality of the LED chip indicates a performance parameter of the LED chip, such as light emission brightness, light emission efficiency, color temperature, and the like. For example, the LED chips having stable light emission brightness may be classified into LED chips of the same quality (or the same Bin). The LED chips having unstable emission brightness may be classified into the LED chips of the same quality. For another example, the LED chips may be classified into different qualities (or Bins) with respect to the degree of stability of the light emission brightness of the LED chips.

After the quality of each LED chip 403 of the load substrate 4 is determined, data support may be provided for the subsequent transfer strategy of the LED chips 403. For example, the LED chips 403 of the load substrate 4 having the same or approximately the same quality may be transferred to the same to-be-transferred substrate 6.

There are various ways to identify the quality of the LED chips 403 in the image. For example, after the image of the LED chips in at least a partial region of the load substrate 4 is captured, a user may subjectively identify the quality of each LED chip 403 in the image, or the quality of each LED chip 403 in the image may be automatically identified by using image processing software designed in advance.

In some embodiments, the apparatus for transferring LED chips further includes: a first processing mechanism 10. The first processing mechanism 10 is coupled to the image capture mechanism 8, the first processing mechanism 10 is configured to process the image information generated by the image capture mechanism 8 to generate a quality distribution of the LED chips 403 in the second radiation region, and the quality distribution includes the position and a corresponding quality of each LED chip 403. In an embodiment of the present disclosure, by providing the first processing mechanism 10 described above, it is possible to automatically identify the quality of the LED chip 403 in the image captured by the image capture mechanism 8.

In an embodiment of the present disclosure, the first processing mechanism 10 is specifically a device, such as a personal computer (PC), which stores an image processing program and may run the image processing program to identify the quality of each LED chip 403 in the image captured by the image capture mechanism 8.

It should be noted that, in practical application, the wavelength of the first light rays, the wavelength of the second light rays, and the material of the dissociation adhesive 402 need to be reasonably selected and designed, so that the dissociation adhesive 402 is dissociated after being irradiated by the first light rays, and the dissociation adhesive 402 is not dissociated after being irradiated by the second light rays, thereby ensuring that the dissociation adhesive 402 is not mistakenly dissociated when the load substrate 4 is subjected to image acquisition.

In some embodiments, the first light source 1 and the second light source 7 are the same light source, which is a tunable light source 9 that may emit light of different wavelengths. For example, the tunable light source may emit both the first light rays having a first wavelength and the second light rays having a second wavelength different from the first wavelength. Exemplarily, the wavelength of the first light rays may be selected from 266 nm, 355 nm, 405 nm, etc., the wavelength of the second light rays may be selected from 325 nm, 355 nm, 405 nm, etc., and the wavelength of the first light rays is not equal to the wavelength of the second light rays.

The first light source 1, the second light source 7, and the tunable light source 9 in the embodiment of the present disclosure may be lasers, and the types of the lasers are not limited to diode pumped solid state lasers (abbreviated as DPSS) or carbon dioxide lattice lasers. Meanwhile, because the size of the laser beam generated by a general laser is limited to a certain extent due to the limitation of the general laser itself, a plurality of lasers may be combined together for use, so that the coverage region of the light rays emitted by the laser can be increased.

In some embodiments, a beam shaper 13 is disposed on a light emitting side of the first light source 1 or the second light source 7, and the light beam emitted by the first light source 1 or the second light source 7 may be converted by the beam shaper to have a flat-topped light spot having uniformly distributed energy, and the light spot may have a square, triangular, circular or other shape. The specific structure of the beam shaper 13 may be set according to actual needs, and will not be described in detail here.

Figure 2B:
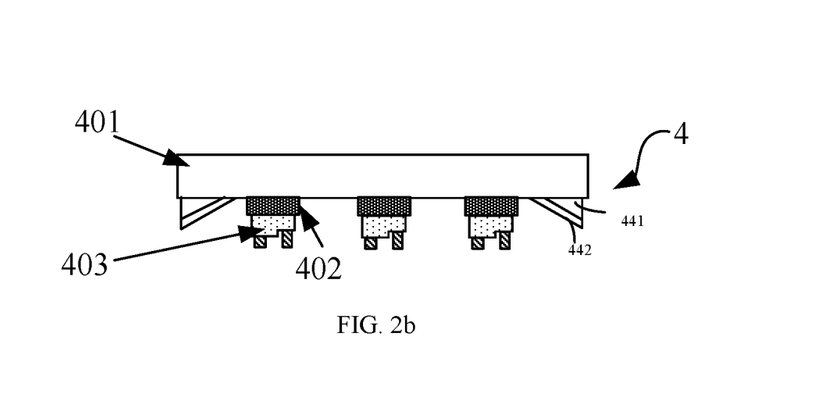
FIG. 2b is a schematic structural diagram of a load substrate according to an embodiment of the disclosure.

In some embodiments, an alignment mark having a reflective effect may be disposed on the load substrate 4, the second light rays are reflected when they irradiate onto the alignment mark, and the image capture mechanism 8 may acquire an image of the alignment mark, so as to precisely align the load substrate 4. In an embodiment, referring to FIG. 2b, the alignment mark may include a transparent layer 441 and a reflective layer 442. The reflective layer 442 may be made of a highly reflective material such as Al or Ag. The alignment mark is provided on a side of the load substrate 4 provided with the LED chips. The reflective layer 442 is inclined with respect to the surface of the load substrate provided with the LED chips.

Figure 3:
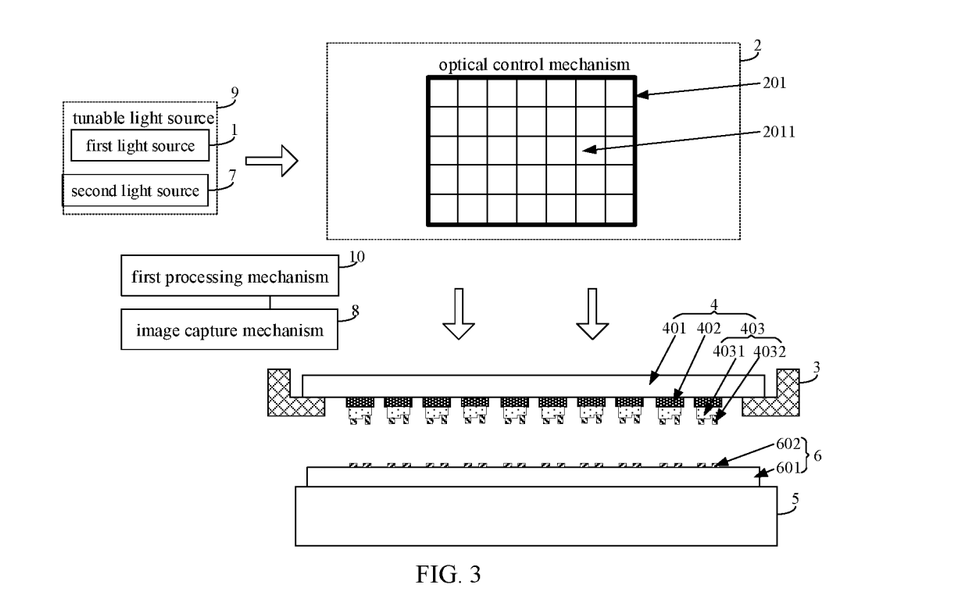
FIG. 3 is a schematic structural diagram of another apparatus for transferring LED chips according to an embodiment of the present disclosure.

FIG. 3 is a schematic structural diagram of another apparatus for transferring LED chips according to an embodiment of the present disclosure. As shown in FIG. 3, in some embodiments, the optical control mechanism 2 includes: an optical filter device 201 including a plurality of optical control elements 2011 arranged in an array. The optical control element 2011 located in the first radiation region is in an active state, and the optical control element 2011 located other than the first radiation region is in an inactive state. The optical control element 2011 is configured to control the propagation direction of the received first light rays when the optical control element is in the active state so as to form the target light rays that irradiate onto the target radiation region of the load substrate 4, and configured to absorb (or block) the received first light rays or reflect the received first light rays to a redundant light region when the optical control element is in the inactive state, where the redundant light region is outside the load substrate 4.

The size of each optical control element 2011 of the optical filter device 201 may be designed according to actual needs, for example, the size of the optical control element 2011 is 8 μm×15 μm or 15 μm×25 μm.

In some other embodiments, the operating status of each optical control element 2011 of the optical filter device 201 is adjustable, so the first radiation region of the optical filter device 201 is adjustable. The optical filter device 201 may be specifically a liquid crystal display (abbreviated as LCD) 201a, a reflective digital micro-mirror, a micro-electromechanical system (abbreviated as MEMS) reflective mirror, or the like, which will be described in detail later with reference to the accompanying drawings.

In an embodiment of the present disclosure, when the first light rays irradiate on the whole optical control mechanism 2, the first light rays pass through the optical control elements 2011, which are located in the first radiation region only and are in the active state, to form the target light rays to irradiate onto the load substrate 4, so that the load substrate 4 is irradiated by the target light rays only at the target radiation region. It can be seen that the optical filter device 201 in the present disclosure has a function of patterning the light rays, and the optical filter device 201 will be described in detail later with reference to some drawings.

Figure 4:
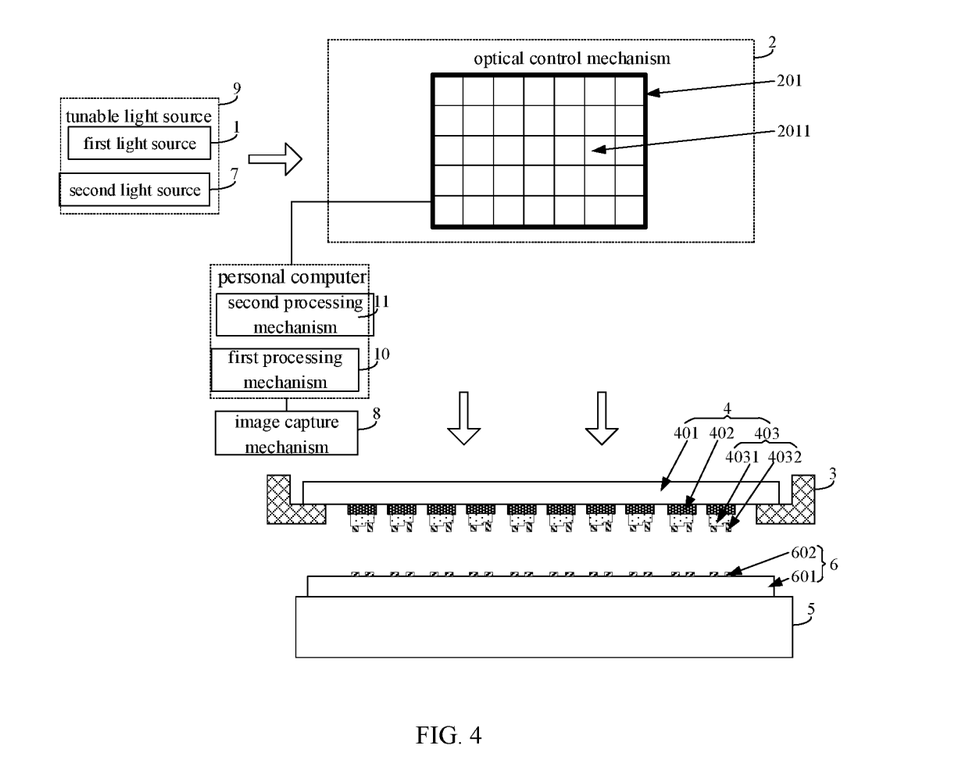
FIG. 4 is a schematic structural diagram of another apparatus for transferring LED chips according to an embodiment of the present disclosure.

FIG. 4 is a schematic structural diagram of another apparatus for transferring LED chips according to an embodiment of the present disclosure. As shown in FIG. 4, in this embodiment, the state of each optical control element 2011 of the optical filter device 201 is adjustable, the first radiation region of the optical filter device 201 is adjustable, and the apparatus for transferring LED chips further includes: a second processing mechanism 11.

In an embodiment, the second processing mechanism 11 is coupled to the optical filter device 201, and the second processing mechanism 11 is configured to send a control signal to the optical filter device 201. The control signal includes identification information of the optical control element 2011 located in the first radiation region. The optical filter device 201 controls the optical control element 2011 located in the first radiation region to be in the active state and controls the optical control element 2011 located other than the first radiation region to be in the inactive state according to the identification information. It can be seen that the first radiation region of the optical filter device 201 can be controlled by the second processing mechanism 11.

In some embodiments, the first processing mechanism 10 and the second processing mechanism 11 are the same processing mechanism, for example, a personal computer having the functions of both the first processing mechanism 10 and the second processing mechanism 11.

In some embodiments, the optical control element 2011 is configured to transmit the first light rays when the optical control element is in the active state and to block the first light rays when the optical control element is in the inactive state.

Figure 5:
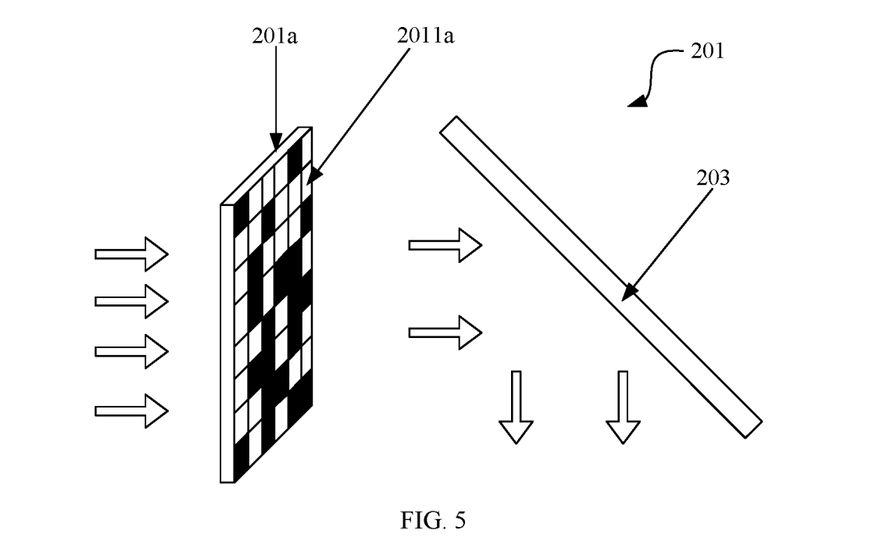
FIG. 5 is a schematic structural diagram of an optical control mechanism according to an embodiment of the present disclosure.

FIG. 5 is a schematic diagram of an optical control mechanism according to an embodiment of the present disclosure. As shown in FIG. 5, in some embodiments, the optical filter device 201 includes: a liquid crystal display 201a including a plurality of first pixel units 2011a arranged in an array, and the first pixel units 2011a serve as the optical control elements 2011.

The first pixel unit 2011a includes a pixel electrode, a common electrode and liquid crystal molecules therebetween, and the light transmittance of the first pixel unit 2011a may be controlled by controlling an electric field between the pixel electrode and the common electrode, so that the first pixel unit 2011a has at least two states, that is, a light-shielding state where complete black is present and a light-transmissive state where transparent state is presented. When the liquid crystal display 201a serves as the optical filter device 201, the first pixel unit 2011a of the liquid crystal display 201a may be used as the optical control element 2011 of the optical filter device 201, where the optical control element 2011 is in the active state when the first pixel unit 2011a is in the light-transmissive state, and the optical control element 2011 is in the inactive state when the first pixel unit 2011a is in the light-shielding state.

In the embodiment shown in FIG. 5, the plane where the liquid crystal display 201a is located intersects with the surface of the light-transmissive substrate 401 away from the LED chips 403. In this case, the optical filter device 201 may further include a reflection unit 203 located on a side of the liquid crystal display 201a away from the first light source 1, and the reflection unit 203 is configured to reflect the first light rays transmitted from the optical control element 2011 onto the target radiation region of the load substrate 4. In an embodiment, the reflection unit 203 may be a reflective mirror. The optical filter device 201 includes the liquid crystal display 201a and the reflection unit 203, so that the position arrangement of the liquid crystal display 201a can be more flexible.

Figure 6:
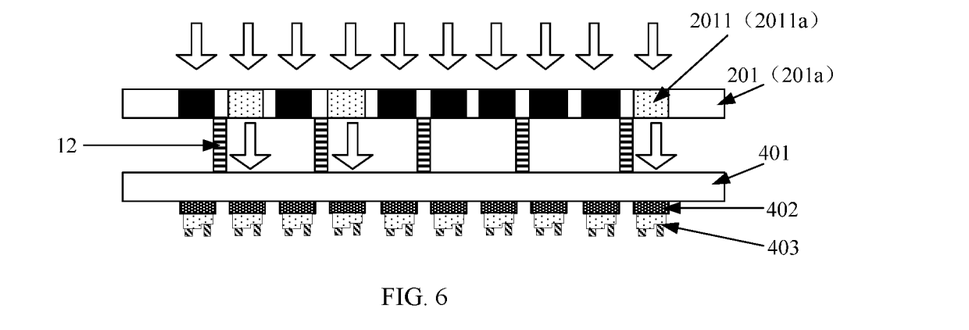
FIG. 6 is another schematic structural diagram of an optical control mechanism according to an embodiment of the present disclosure.

FIG. 6 is another schematic structural diagram of an optical control mechanism according to an embodiment of the disclosure. As shown in FIG. 6, unlike the case shown in FIG. 5, in the apparatus for transferring LED chips shown in FIG. 6, the plane on which the liquid crystal display 201a is located is parallel to the surface of the light-transmissive substrate 401 away from the LED chips 403.

As an alternative, continued to FIG. 6, the apparatus for transferring LED chips further includes a plurality of support mechanisms 12, and the support mechanisms 12 are between the liquid crystal display 201a and the light-transmissive substrate 401 and configured to support the liquid crystal display and the light-transmissive substrate 401.

In some embodiments, orthographic projections of the support mechanisms 12 on the light-transmissive substrate 401 do not overlap with the orthographic projections of the LED chips 403 on the light-transmissive substrate, so as to avoid the support mechanisms 12 blocking light to the LED chips 403.

In some embodiments, the support mechanism 12 has a column shape, the maximum width of the cross section of the column-shaped support mechanism 12 is less than or equal to 10 μm, and the height of the column-shaped support mechanism 12 ranges from 10 μm to 20 μm. The space between adjacent support mechanisms 12 is less than or equal to 500 μm. In addition, to ensure uniformity of the gap between the liquid crystal display 201a and the light-transmissive substrate 401, a plurality of support mechanisms 12 are uniformly distributed between the liquid crystal display 201a and the light-transmissive substrate 401.

In the solution shown in FIG. 6, the size of the liquid crystal display 201a may be designed to match the size of the light-transmissive substrate 401, and the size of the optical control element 2011 of the liquid crystal display 201a may be designed to match the size of the LED chip 403 of the load substrate 4, so as to facilitate alignment of the LED chip and the optical control element. In this solution, the orthographic projection of the first radiation region of the liquid crystal display 201a and the target radiation region of the load substrate 4 on the light-transmissive substrate completely overlap.

In some embodiments, the optical control element 2011 of the optical filter device 201 of the apparatus for transferring LED chips is configured to reflect the first light rays that irradiate onto the optical control element 2011 to the target radiation region of the load substrate 4 when the optical control element 2011 is in the active state, and to reflect the first light rays that irradiate onto the optical control element 2011 to a redundant light region when the optical control element 2011 is in the inactive state.

In some embodiments, the optical filter device 201 includes: a reflective digital micro-mirror device or a MEMS reflective mirror; and both the reflective digital micro-mirror device and the MEMS reflective mirror include a plurality of second pixel units that may serve as optical control elements 2011.

Figure 7:
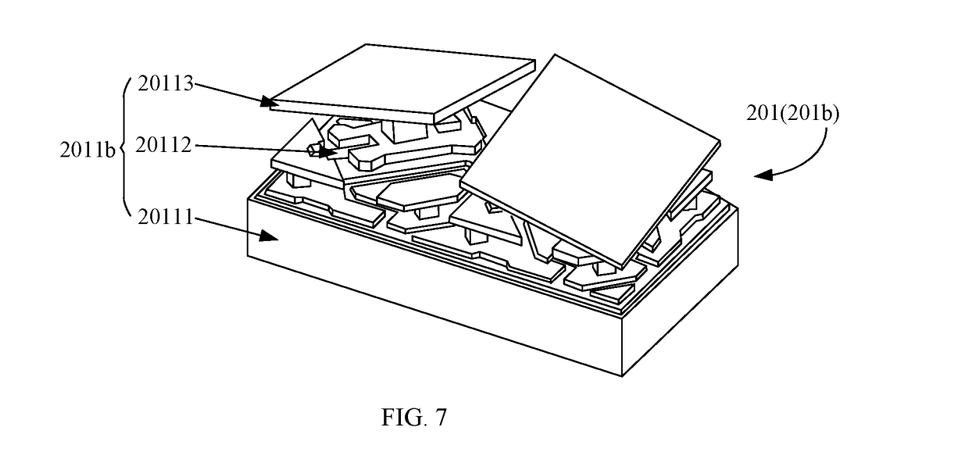
FIG. 7 is a schematic structural diagram of a reflective digital micro-mirror according to an embodiment of the present disclosure.

FIG. 7 is a schematic structural diagram of a digital micro-mirror device according to an embodiment of the present disclosure. As shown in FIG. 7, the reflective digital micro-mirror device 201b includes a plurality of second pixel units 2011b (only two second pixel units are exemplarily shown in the figure), and the second pixel unit 2011b includes: a micro-mirror 20113, a torsion hinge 20112, a CMOS circuit 20111, and an address electrode. In an embodiment, the micro-mirror 20113 is coupled to the underlying torsion hinge 20112 by a via, and the CMOS circuit 20111 is coupled to the address electrode. The second pixel unit 2011b in the digital micro-mirror controls the CMOS circuit 20111 to supply power to a corresponding address electrode in an addressing manner, so that the address electrode is charged, an electrostatic field between the micro-mirror 20113 and the address electrode generates an electrostatic torque, and the electrostatic torque overcomes a restoring torque of the torsion hinge 20112, and thus the micro-mirror 20113 orientates forwardly or reversely. In an embodiment, the angle of deflection is precisely controlled by the mechanical structure, and the micro-mirror 20113 is made of a material having high reflectivity, such as Al.

Figure 8:
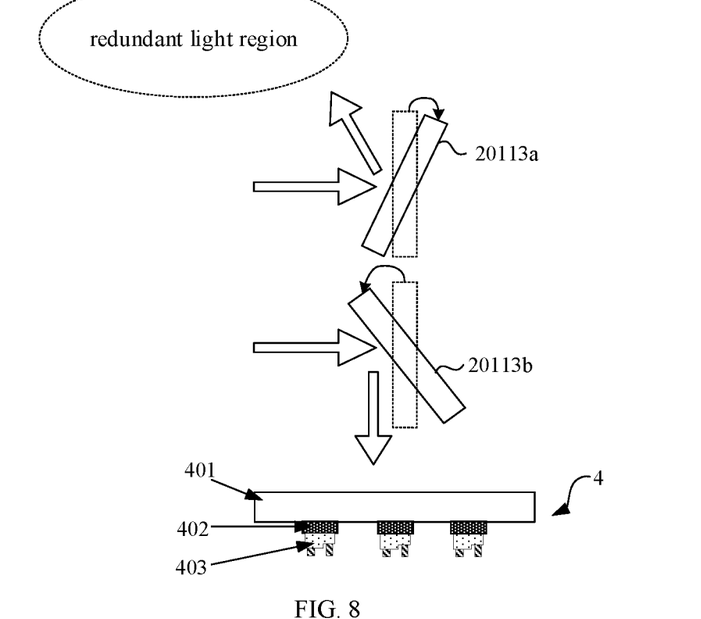
FIG. 8 is a schematic diagram of light paths at two micro-mirrors having different deflection directions according to an embodiment of the disclosure.

FIG. 8 is a schematic diagram of light paths at two micro-mirrors 20113 having different deflection directions according to an embodiment of the present disclosure. As shown in FIG. 8, by controlling the deflection direction (forward deflection or reverse deflection) of the micro-mirrors 20113, the first light rays that irradiate onto the micro-mirrors 20113 are reflected and then irradiate onto the target radiation region of the load substrate 4 or reflected to the redundant light region. Exemplarily, the micro-mirrors 20113 may be designed to reflect the first light rays to the target radiation region of the load substrate 4 when the micro-mirrors are in forward deflection and to reflect the first light rays to the redundant light region when the micro-mirrors are in reverse deflection.

By taking the case shown in FIG. 8 as an example, the micro-mirror 20113a performs reverse deflection (clockwise deflection in FIG. 8), and the micro-mirror 20113a reflects the first light rays to the redundant light region, i.e., the optical control element 2011 is in the inactive state; and the micro-mirror 20113b performs forward deflection (counterclockwise deflection in FIG. 8), and reflects the first light rays to the target radiation region of the load substrate 4, i.e. the optical control element 2011 is in the active state.

Figure 9:
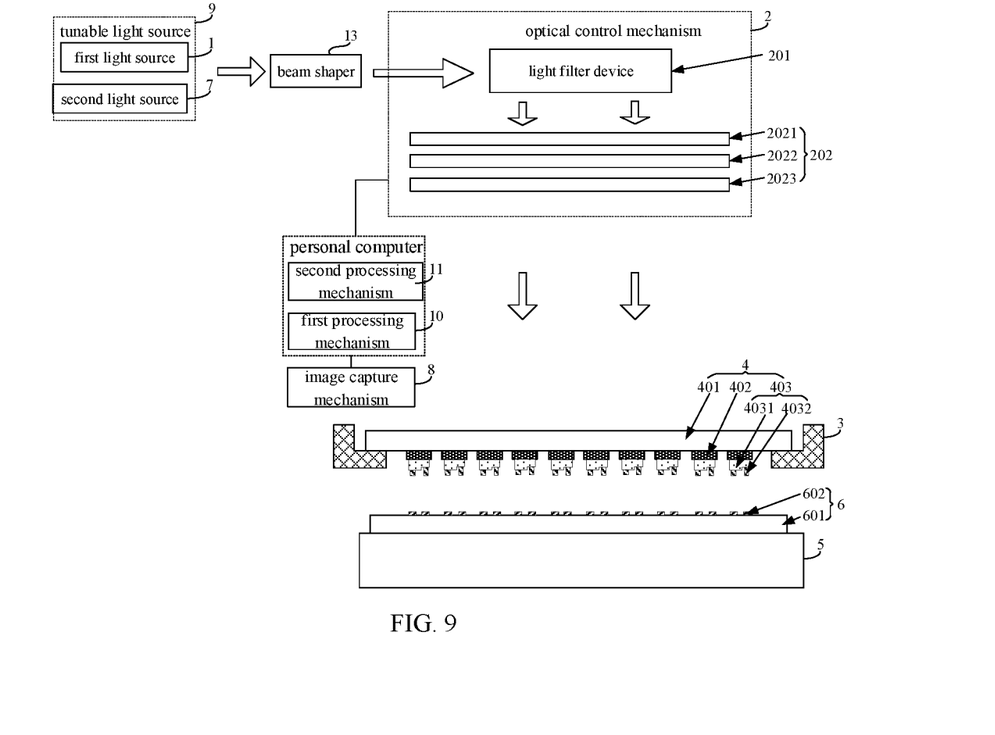
FIG. 9 is a schematic structural diagram of another apparatus for transferring LED chips according to an embodiment of the present disclosure.

FIG. 9 is a schematic structural diagram of another apparatus for transferring LED chips according to an embodiment of the present disclosure. As shown in FIG. 9, unlike the previous embodiments, in the apparatus for transferring LED chips shown in FIG. 9, the optical control mechanism 2 includes not only the optical filter device 201 but also the beam control device 202. The beam control device 202 is located on the light emitting side of the optical filter device 201, and the beam control device 202 is configured to adjust at least one of the shape, size, and energy distribution of a light spot formed by the irradiation of the target light rays, emitted from each optical control element 2011, onto the load substrate 4.

In some embodiments, the beam control device 202 includes: at least one of a beam expander 2021, a galvo scanner 2022, and a field lens 2023. In an embodiment, the beam expander 2021 is configured to expand the light rays. Exemplarily, when a laser beam passes through a beam expander 2021 having an X factor, the waist radius of the laser beam increases by X times, and the divergence angle of the laser beam decreases to 1/X of its original value. The galvo scanner 2022, also commonly referred to as scanning galvo scanner 2022, generally includes: an X-Y optical scanning head, an electronic driving amplifier and a reflective mirror. The working principle of the galvo scanner 2022 is to make laser beam incident on two scanning heads, and use computer to control the reflecting angle of the reflective mirror, and these two scanning heads can respectively scan along X, Y axes so as to change the propagation direction of light rays. The field lens 2023, also commonly referred to as a focusing lens, is used to determine the range of final extracted light.

In practical application, the beam expander 2021, the galvo scanner 2022 and the field lens 2023 may be used in combination. Generally, the light emitting side of the optical filter device 201 is opposite to the light incident side of the beam expander 2021, the light emitting side of the beam expander 2021 is opposite to the light incident side of the galvo scanner 2022, the light emitting side of the galvo scanner 2022 is opposite to the light incident side of the field lens, and the light emitted by the optical filter device 201 passes through the beam expander 2021, the galvo scanner 2022, and the field lens 2023 in sequence, and finally irradiates the target radiation region of the load substrate 4. Of course, one or two of the beam expander 2021, the galvo scanner 2022, and the field lens 2023 may be optionally provided.

It should be noted that, the case where the beam control device 202 described above includes at least one of the beam expander 2021, the galvo scanner 2022, and the field lens 2023 is only an example, and does not limit the technical solution of the present disclosure. In an embodiment of the present disclosure, any structure capable of adjusting at least one of the shape, the size, and the energy distribution of the light spot formed by the arrival of the target light rays emitted by the optical control element 2011 at the load substrate 4 may be used as the beam control device 202 in the present disclosure.

In an embodiment of the present disclosure, at least one of the shape, the size, and the energy distribution of the light spot formed by the arrival of the target light ray emitted from each optical control element 2011 at the load substrate 4 may be adjusted by the beam control device 202, so as to adapt to different application scenarios, such as the cases where the size of the LED chip 403 on the load substrate 4 changes, the pitch between the LED chips 403 on the load substrate 4 changes, or the shape of the LED chip 403 changes.

The working process of the apparatus for transferring LED chips according to an embodiment of the present disclosure may include a first stage to a third stage.

The first stage is also called an image acquisition stage of the load substrate. In an embodiment, the whole load substrate or a partial region of the load substrate is scanned by the second light rays emitted by the second light source (that is, the second radiation region may be the whole region of the load substrate or a partial region of the load substrate, and the specific region may be preset according to actual needs), the reflected light rays are collected by the image capture mechanism, and an image of the whole load substrate or a partial region of the load substrate is generated. In this process, at least portions of the optical control elements of the optical filter device may be controlled to be in the active state, so that the second light rays can irradiate onto at least a partial region of the load substrate. It can be understood that when the second light rays irradiate onto the respective LED chips of the load substrate, each LED chip may be excited to emit light. In this way, the image capture mechanism may capture the LED chip that emits light to form a first image.

The second stage is also called quality identification stage of the LED chip. In an embodiment, the first processing mechanism processes the first image generated by the image capture mechanism to generate distribution information (hereinafter referred to as quality distribution) of the quality of the LED chips in the second radiation region, that is, to determine the position of each LED chip in the second radiation region and the quality of each LED chip. That is, the first processing mechanism may identify the quality of each LED chip from the image captured when each LED emits light (that is, the LED chips are binned).

The third stage is also called LED chip transfer stage. In an embodiment, firstly, the target radiation region is determined on an load substrate based on the quality distribution in the second radiation region of the load substrate acquired in advance, where the LED chips located in the target radiation region needs to be transferred synchronously; then, the corresponding first radiation region of the optical control mechanism is determined according to the determined target radiation region, and the optical control elements located in the first radiation region are identified to obtain identification information; then, a control signal is sent to the optical filter device by the second processing mechanism, where the control signal includes identification information of the optical control elements in the first radiation region; then, the optical filter device controls the optical control elements in the first radiation region to be in the active state, and controls the optical control elements other than the first radiation region to be in the inactive state, according to the control signal, so that the first radiation region of the optical control mechanism is adjusted and controlled. Next, the first light source is turned on and the first light rays emitted by the first light source completely cover the first radiation region of the optical control mechanism, and the propagation direction of the first light rays that irradiate onto the first radiation region of the optical control mechanism is controlled, so as to form the second light rays that irradiate onto the target radiation region of the load substrate at a side of the light-transmissive substrate away from the LED chips, and thus the dissociation adhesive in the target radiation region is dissociated, thereby transferring the LED chips in the target radiation region to the to-be-transferred substrate.

As an application scenario, when the target radiation region is determined on the load substrate, the region where the LED chips with the same or approximately the same quality are located may be selected as the target radiation region, so that the LED chips transferred to the same to-be-transferred substrate have the same or approximately the same quality. Furthermore, the LED chips on the different load substrates and with the same or approximately the same quality may be transferred to the same to-be-transferred substrate in batches, and in this case, the quality of all the LED chips on the to-be-transferred substrate is the same or approximately the same, so that the uniformity of the display effect of the display device is favorably improved.

As another application scenario, the LED chips on the same load substrate and with different qualities may be transferred to a plurality of different to-be-transferred substrates respectively by a plurality of transfer steps, and the qualities of the LED chips transferred simultaneously in any one transfer step are the same or approximately the same.

It should be noted that different features in the above embodiments may be combined with each other, and the technical solutions obtained by combining the features also fall within the scope of the present disclosure.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. An apparatus for transferring light emitting diode (LED) chips, comprising:
    a tunable first light source configured to generate and emit first light rays and second light rays, wherein a wavelength of the first light rays and a wavelength of the second light rays are different;
    a first support structure configured to carry a load substrate, the load substrate comprising a light-transmissive substrate and the LED chips fixed on a side of the light-transmissive substrate away from the tunable first light source by dissociation adhesive;
    a second support structure configured to carry a to-be-transferred substrate, the to-be-transferred substrate being on a side of the LED chips away from the light-transmissive substrate; and
    an optical control mechanism on a side of the light-transmissive substrate away from the LED chips and configured to control a propagation direction of the first light rays that irradiate onto a first radiation region of the optical control mechanism to form target light rays that irradiate onto a target radiation region of the load substrate, so that the dissociation adhesive in the target radiation region is dissociated to transfer the LED chips in the target radiation region to the to-be-transferred substrate,
    wherein the second light rays is configured to pass through the optical control mechanism and irradiate onto the load substrate so as to excite the LED chips to emit light; and
    the second light rays and the dissociation adhesive are configured such that the dissociation adhesive is not dissociated in a case where being subjected to irradiation of the second light rays,
    wherein the optical control mechanism comprises: an optical filter device;
    the optical filter device comprises: a plurality of optical control elements arranged in an array, the optical control elements located in the first radiation region being in an active state, and the optical control elements not located in the first radiation region being in an inactive state; and
    each of the plurality of optical control elements is configured to control a propagation direction of the received first light rays in response to the optical control element being in the active state, so as to form the target light ray that irradiates onto the target radiation region of the load substrate,
    wherein the optical control element is configured to reflect the first light rays that irradiate onto the optical control element to the load substrate in response to the optical control element being in the active state and to reflect the first light rays that irradiate onto the optical control element to a redundant light region in response to the optical control element being in the inactive state, and the redundant light region is on a side of the optical control mechanism away from the load substrate,
    wherein the optical filter device comprises: a reflective digital micro-mirror device;
    the reflective digital micro-mirror comprises a plurality of second pixel units, each of the plurality of second pixel units serving as a corresponding one of the plurality of optical control elements;
    each of the plurality of second pixel unit comprises: a micro-mirror, a torsion hinge, a CMOS circuit, and an address electrode; and
    the micro-mirror is coupled to the torsion hinge by a via, and the CMOS circuit is coupled to the address electrode.

2. The apparatus of claim 1, further comprising:
    an image capture mechanism configured to capture an image of the LED chips that emit light to generate a first image.

3. The apparatus of claim 2, further comprising:
    a first processing mechanism coupled to the image capture mechanism and configured to process the first image generated by the image capture mechanism to generate a quality distribution of the LED chips, the quality distribution indicates a correspondence relationship between a position of each of the LED chips and a quality of a corresponding one of the LED chips, and the quality of the corresponding one of the LED chips indicates whether a brightness of light emitted by the corresponding one of the LED chips is stable.

4. The apparatus of claim 3, wherein the LED chips in the target radiation region have a same quality.

5. The apparatus of claim 1, wherein the first radiation region comprises a plurality of first sub-regions, the target radiation region comprises a plurality of second sub-regions, and the plurality of first sub-regions are in one-to-one correspondence with the plurality of second sub-regions.

6. The apparatus of claim 1, further comprising:
    a second processing mechanism coupled to the optical filter device and configured to send a control signal to the optical filter device, the control signal comprising identification information of the plurality of optical control elements in the first radiation region,
    wherein the optical filter device controls the plurality of optical control elements in the first radiation region to be in the active state according to the control signal.

7. The apparatus of claim 1, wherein each of the plurality of optical control elements is configured to transmit the first light rays that irradiate onto the optical control element in response to the optical control element being in the active state and to block the first lights ray that irradiate onto the optical control element in response to the optical control element being in the inactive state.

8. The apparatus of claims 1, wherein the optical control mechanism further comprises: a beam control device; and
the beam control device is on a light emitting side of the optical filter device and is configured to adjust at least one of a shape, a size and an energy distribution of light spots of the target light rays that irradiate onto the load substrate.

9. The apparatus of claim 8, wherein the beam control device comprises: at least one of a beam expander, a galvo scanner, and a field lens.

10. The apparatus of claim 9, wherein the load substrate further comprises an alignment mark on a side of the load substrate on which the LED chips are provided, the alignment mark comprises a reflective layer and a transparent layer, and
the reflective layer is inclined with respect to a surface of the load substrate on which the LED chips are provided.

11. The apparatus of claim 8, wherein
the beam control device includes: a beam expander, a galvo scanner, and a field lens,
a light emitting side of the optical filter device is opposite to a light incident side of the beam expander, a light emitting side of the beam expander is opposite to a light incident side of the galvo scanner, a light emitting side of the galvo scanner is opposite to a light incident side of the field lens, and light emitted by the optical filter device passes through the beam expander, the galvo scanner, and the field lens in sequence, and finally irradiates the target radiation region of the load substrate.

* * * * *